United States Patent
Godet et al.

(10) Patent No.: US 9,553,174 B2
(45) Date of Patent: Jan. 24, 2017

(54) CONVERSION PROCESS UTILIZED FOR MANUFACTURING ADVANCED 3D FEATURES FOR SEMICONDUCTOR DEVICE APPLICATIONS

(71) Applicant: Applied Materials, Inc., Santa Clara, CA (US)

(72) Inventors: Ludovic Godet, Sunnyvale, CA (US); Christopher Hatem, Billerica, MA (US); Matthew D. Scotney-Castle, Morgan Hill, CA (US); Martin A. Hilkene, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/622,647

(22) Filed: Feb. 13, 2015

(65) Prior Publication Data

US 2015/0279974 A1 Oct. 1, 2015

Related U.S. Application Data

(60) Provisional application No. 61/988,351, filed on May 5, 2014, provisional application No. 61/971,955, filed on Mar. 28, 2014.

(51) Int. Cl.
*H01L 29/66* (2006.01)
*H01L 21/30* (2006.01)
(Continued)

(52) U.S. Cl.
CPC ......... *H01L 29/66803* (2013.01); *H01L 21/30* (2013.01); *H01L 21/02238* (2013.01);
(Continued)

(58) Field of Classification Search
CPC ...................................................... H01L 29/66
(Continued)

(56) References Cited

U.S. PATENT DOCUMENTS

| 2004/0150029 A1 | 8/2004 | Lee |
| 2005/0093154 A1 | 5/2005 | Kottantharayil et al. |

(Continued)

FOREIGN PATENT DOCUMENTS

| KR | 2007-0101058 A | 10/2007 |

OTHER PUBLICATIONS

PCT Search Report and Written Opinion for PCT/US2015/015998, dated Aug. 26, 2015 (9 pgs.).

*Primary Examiner* — Whitney T Moore
*Assistant Examiner* — Rodolfo D Fortich
(74) *Attorney, Agent, or Firm* — Patterson & Sheridan, LLP

(57) ABSTRACT

Embodiments of the present invention provide methods for forming fin structure with desired materials using a conversion process for three dimensional (3D) stacking of fin field effect transistor (FinFET) for semiconductor chips. In one embodiment, a method of forming a fin structure on a substrate includes performing an directional plasma process on a fin structure formed from a substrate comprising a first type of atoms, the directional plasma process dopes a second type of atoms on sidewalls of the fin structure, performing a surface modification process to form a surface modified layer on the sidewalls of the fin structure reacting with the first type of atoms, replacing the first type of the atoms with the second type of the atoms in the fin structure during the surface modification process, and forming the fin structure including the second type of the atoms on the substrate.

20 Claims, 11 Drawing Sheets

(51) Int. Cl.
    *H01L 21/306*     (2006.01)
    *H01L 21/02*      (2006.01)
    *H01L 21/3065*    (2006.01)
(52) U.S. Cl.
    CPC .. *H01L 21/02247* (2013.01); *H01L 21/02252* (2013.01); *H01L 21/3065* (2013.01); *H01L 21/30604* (2013.01)
(58) Field of Classification Search
    USPC .................. 438/283, 229, 151, 157, 217
    See application file for complete search history.

(56) References Cited

U.S. PATENT DOCUMENTS

| | | | |
|---|---|---|---|
| 2008/0003725 A1 | 1/2008 | Orlowski | |
| 2009/0020786 A1* | 1/2009 | Lenoble | H01L 21/0337 257/213 |
| 2012/0070953 A1* | 3/2012 | Yu | H01L 21/2236 438/301 |
| 2012/0112248 A1* | 5/2012 | Wu | H01L 21/2236 257/255 |
| 2013/0334605 A1 | 12/2013 | Wu et al. | |

\* cited by examiner

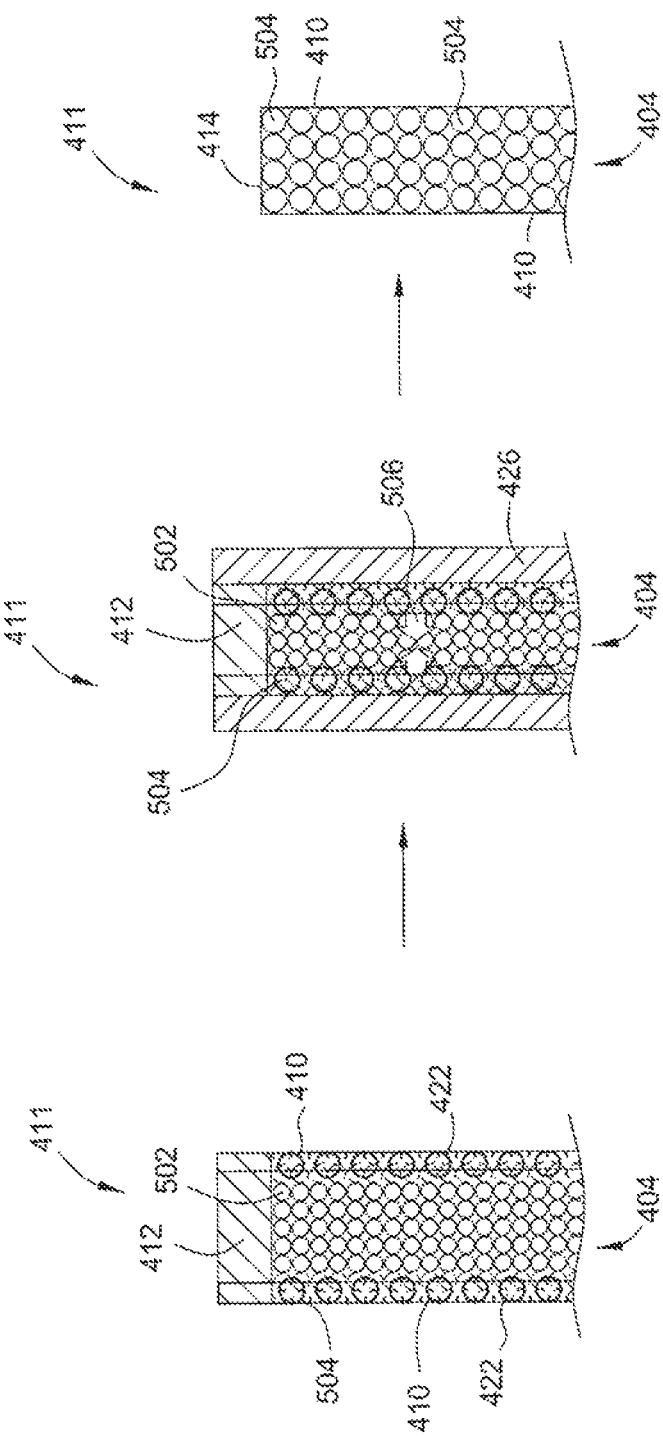

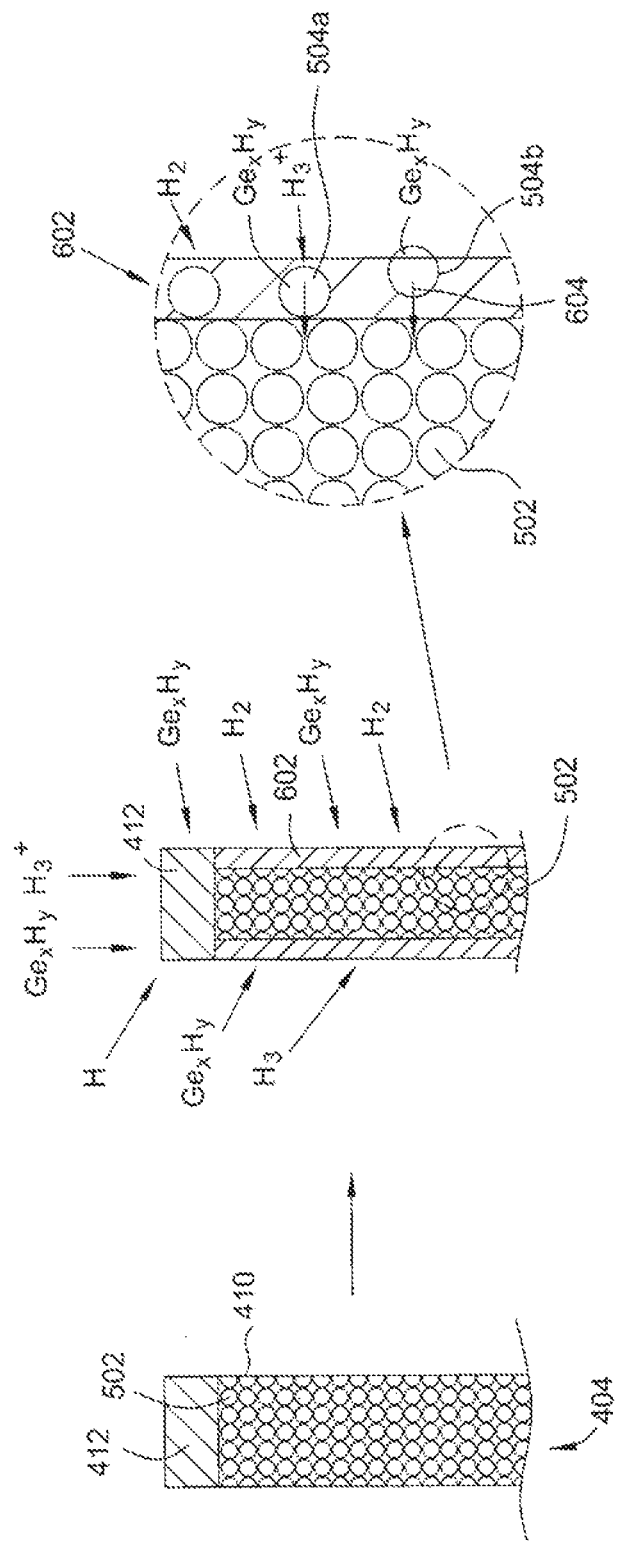

CONVERSION PROCESS UTILIZED FOR MANUFACTURING ADVANCED 3D FEATURES FOR SEMICONDUCTOR DEVICE APPLICATIONS

CROSS-REFERENCE TO RELATED APPLICATIONS

This application claims benefit of U.S. Provisional Application Ser. No. 61/971,955 filed Mar. 28, 2014 and U.S. Provisional Application Ser. No. 61/988,351 filed May 5, 2014, which are incorporated by references in their entireties.

BACKGROUND

Field

Embodiments of the present invention generally relate to methods for forming fin structures with desired materials on a semiconductor substrate, and more particularly to methods for forming fin structures on a semiconductor substrate utilizing a conversion process to convert the fin structure to have a desired material fin field effect transistor (FinFET) semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable fabrication of next generation devices and structures, three dimensional (3D) stacking of semiconductor chips is often utilized to improve performance of the transistors. In particular, fin field effect transistors (FinFET) are often utilized to form three dimensional (3D) stacking of semiconductor chips. By arranging transistors in three dimensions instead of conventional two dimensions, multiple transistors may be placed in the integrated circuits (ICs) very close to each other. Recently, complementary metal oxide semiconductor (CMOS) FinFET devices have been widely used in many logic and other applications and are integrated into various different types of semiconductor devices. FinFET devices typically include semiconductor fins with high aspect ratios in which the channel and source/drain regions for the transistor are formed thereover. A gate electrode is then formed over and along side of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow.

FIG. 1A depicts an exemplary embodiment of a fin field effect transistor (FinFET) 150 disposed on a substrate 100. The substrate 100 may be a silicon substrate, a germanium substrate, or a substrate formed from other semiconductor materials. In one embodiment, the substrate 100 may include p-type or n-type dopants doped therein. The substrate 100 includes a plurality of semiconductor fins 102 formed thereon isolated by shallow trench isolation (STI) structures 104. The shallow trench isolation (STI) structures 104 may be formed by an insulating material, such as a silicon oxide material, a silicon nitride material or a silicon carbon nitride material.

The substrate 100 may include a portion in NMOS device region 101 and a portion in PMOS device region 103 as needed, and each of the semiconductor fins 102 may be sequentially and alternatively formed in the NMOS device region 101 and the PMOS device region 103 in the substrate 100. The semiconductor fins 102 are formed protruding above the top surfaces of the shallow trench isolation (STI) structures 104. Subsequently, a gate structure 106, typically including a gate electrode layer disposed on a gate dielectric layer, is deposited on both of the NMOS device region 101 and the PMOS device region 103 and over the semiconductor fins 102.

The gate structure 106 may be patterned to expose portions 148, 168 of the semiconductor fins 102, 152 uncovered by the gate structure 106. The exposed portions 148, 168 of the semiconductor fins 102 may then be doped with dopants to form lightly doped source and drain (LDD) regions using an implantation process.

FIG. 1B depicts a cross sectional view of the substrate 100 including the plurality of semiconductor fins 102 formed on the substrate 100 isolated by the shallow trench isolation (STI) structures 104. The plurality semiconductor fins 102 formed on the substrate 100 may be part of the substrate 100 extending upwards from the substrate 100 utilizing the shallow trench isolation (STI) structures 104 to isolate each of the semiconductor fins 102. In another embodiment, the semiconductor fins 102 may be individually formed structures disposed on the substrate 100 that are made from materials different than the substrate 100 using suitable techniques available in the art. In the embodiment wherein different materials of the semiconductor fins 102 are required, additional process steps may be performed to replace or alter the materials of the semiconductor fins 102 formed from the substrate 102.

Germanium containing material, such as SiGe containing material or Ge alloys, group III-V materials or other compound materials are often selected to be doped into the semiconductor fin 102 or to manufacture the structures of the semiconductor fins 102 on the substrate for different device performance requirements. In one example, SiGe or Ge dopants are often used to form the semiconductor fin 102 to improve the device performance.

However, as the designs of the three dimensional (3D) stacking of fin field effect transistor (FinFET) 150 are pushed up against the technology limits for the structure geometry, the need for accurate process control for the manufacture of semiconductor fins 102 on the substrate 100 has become increasingly important. Conventional processes for manufacturing composite materials for the semiconductor fin 102 often suffer from high cost, complicated process steps, poor dopant concentration control, poor profile control and difficult thermal budget control, thereby resulting in resulting in inaccurate semiconductor fin profile control, poor dimension control and undesired defect formation. Furthermore, conventional process for forming the semiconductor fin 102 with Ge compounds, such as Ge-on-insulator (GeOI) process, often requires multiple complicated process sequences and steps to complete the process, which may adversely cause high manufacture cost, cycle time, and high doping dose and extra long doping time.

Thus, there is a need for improved methods for forming semiconductor fin structure with different materials on a substrate with good profile and dimension control for three dimensional (3D) stacking of semiconductor chips or other semiconductor devices.

SUMMARY

Embodiments of the present invention provide methods for forming fin structure with desired materials using a conversion process for three dimensional (3D) stacking of fin field effect transistor (FinFET) for semiconductor chips. In one embodiment, a method of forming a fin structure on a substrate includes performing a directional plasma process on a fin structure formed from a substrate comprising predominantly a first type of atoms, the directional plasma process dopes a second type of atoms on sidewalls of the fin structure, performing a surface modification process to form a surface modified layer on the sidewalls of the fin structure reacting with the first type of atoms, and replacing the first type of the atoms with the second type of the atoms in the fin structure during the surface modification process until the fin structure predominantly comprises the second type of the atoms on the substrate.

In another embodiment, a method of forming a fin structure on a substrate includes doping first type of atoms into a fin structure formed on a substrate, the fin structure predominantly comprising a second type of atoms, oxidizing or nitridizing the fin structure to react with the second type of atoms, forming an oxidation layer or a nitridation layer on the fin structure, and converting the fin structure to be predominantly comprises by the first type of atoms.

In yet another embodiment, a method of forming a fin structure on a substrate includes doping first type of atoms into sidewalls of a fin structure formed on a substrate, the fin structure formed predominantly from a second type of atoms, diffusing the first type of atoms to a center region where the second type of atoms located in the in structure, and replacing the second type of atoms with the first type of atoms until the fin structure is predominantly comprised of the first type of atoms.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5A-5C depict magnified view of substrate structures with desired materials during the manufacturing process;

FIG. 6A-6C depict magnified view of substrate structures with desired materials during the manufacturing process;

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide methods for manufacturing fin structures with desired materials using a conversion process in semiconductor applications. The method is particularly useful for three dimensional (3D) stacking of fin field effect transistor (FinFET) semiconductor structures. In one embodiment, the fin structures formed on a substrate with a first type of atoms may be converted to a second type of atoms using a conversion process. During manufacturing, a directional plasma process may be utilized to dope the second type of atoms into certain regions of the fin structure. The second type of atoms may be later driven into the fin structure to replace the first type of atoms from the fin structure. The first type of atoms may later be removed from the fin structure using a low temperature surface modification process.

Figure 1A:
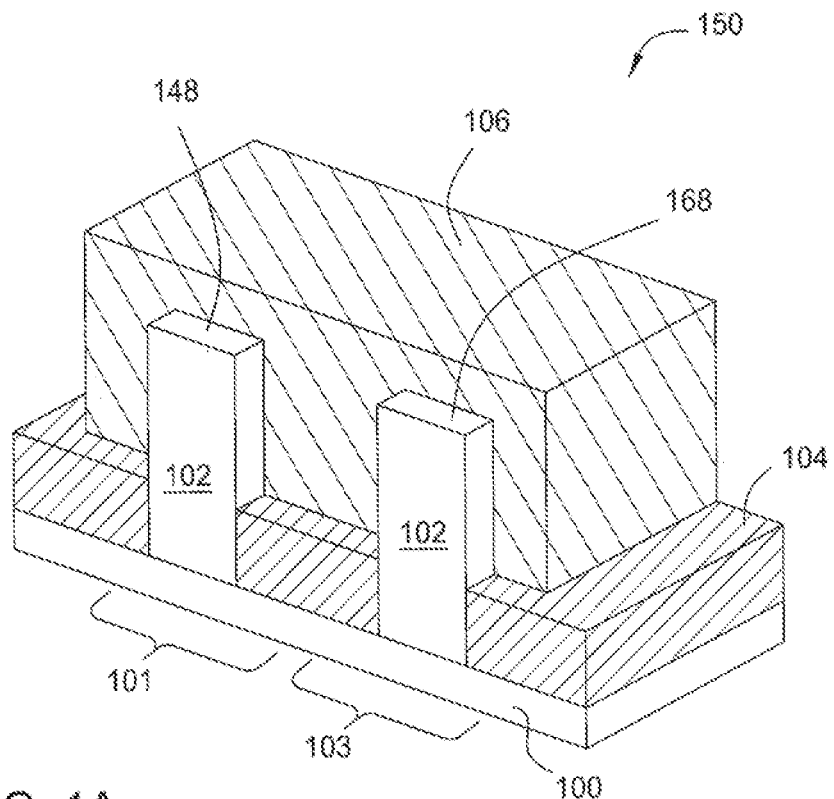
FIG. 1A depicts a schematic perspective view of a substrate having a fin field effect transistor (FinFET) structure formed thereon in a conventional manner.
Figure 1B:
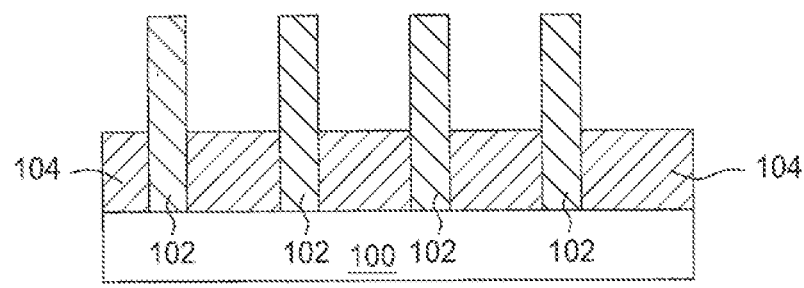
FIG. 1B depicts a cross sectional view of a substrate having a portion of the fin field effect transistor (FinFET) structure formed thereon in a conventional manner.
Figure 2A:
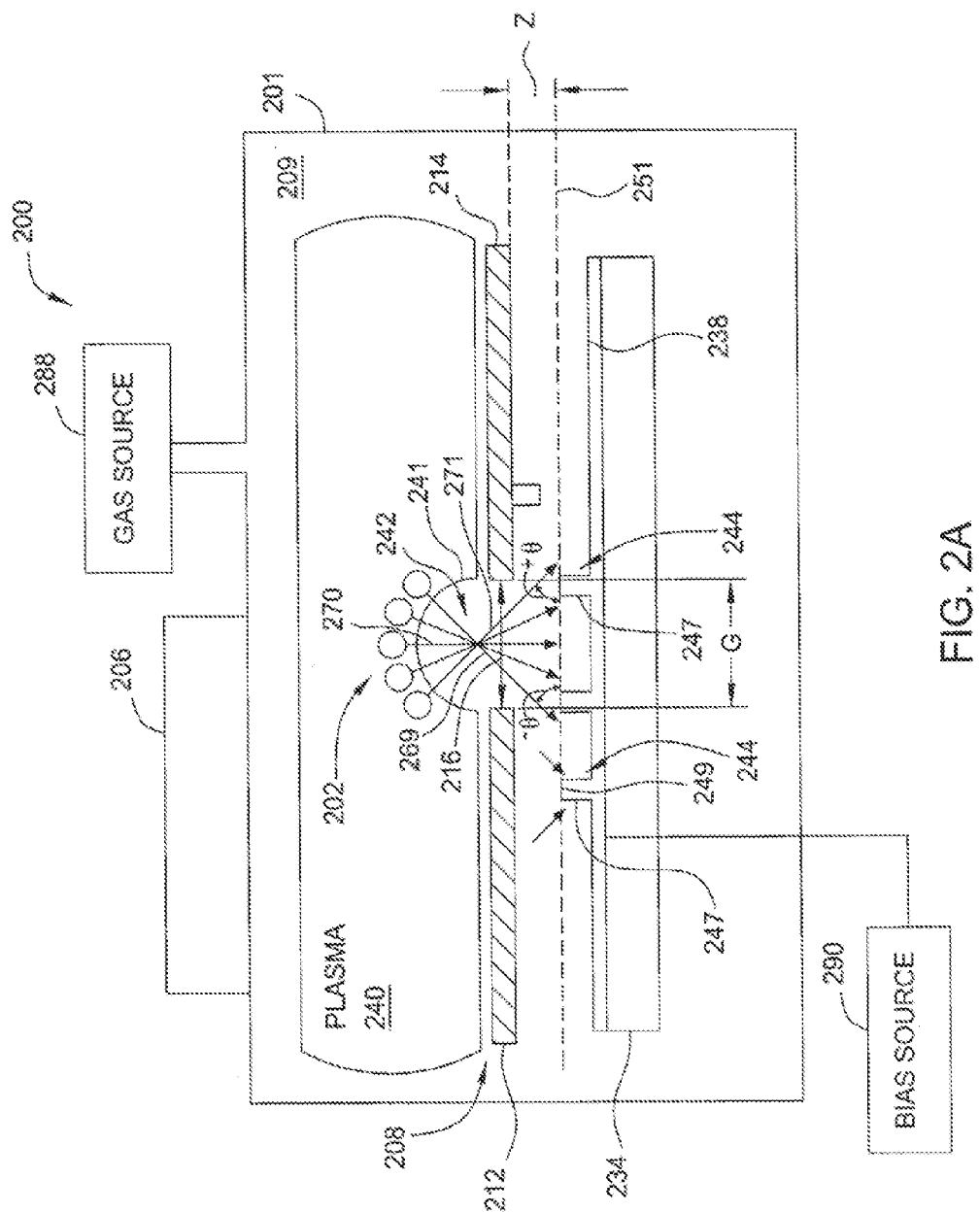
FIG. 2A depicts an apparatus which may be utilized to form dopants in a structure on a substrate.

FIG. 2A is a sectional view of one embodiment of a processing chamber 200 suitable for doping dopants into a substrate. Suitable processing chambers that may be adapted for use with the teachings disclosed herein include, for example, a processing chamber available from Applied Materials, Inc. of Santa Clara, Calif. Although the processing chamber 200 is shown including a plurality of features that enable ion doping performance, it is contemplated that other processing chambers from other manufactures may also be adapted to benefit from one or more of the inventive features disclosed herein. The processing chamber 200 as described herein may be utilized as a plasma doping apparatus. However, the processing chamber 200 may also include, but not be limited to, etching and deposition systems. Furthermore, the plasma doping apparatus can perform many differing material modification processes on a substrate. One such process includes doping a substrate, such as a semiconductor substrate, with desired dopants.

The processing chamber 200 may include chamber body 201 defining an interior processing region 209. A substrate support 234 is disposed in the processing chamber 200 through its bottom. A substrate 238 having features 244 formed thereon may be disposed on the substrate support 234 during a directional plasma process. The substrate 238 may include, but not be limited to, a semiconductor wafer, flat panel, solar panel, and polymer substrate. The semiconductor wafer may have a disk shape with a diameter of 200 millimeters (mm), 300 millimeters (mm) or 450 millimeters (mm) or other size, as needed.

A RF plasma source 206 is coupled to the chamber body 210 and configured to generate a plasma 240 in the processing chamber 200. In the embodiment of FIG. 2A, an insulating modifier 208 is disposed in the interior processing region 209 includes a pair of modifier 212, 214 defining a gap 216 therebetween defining a horizontal spacing (G). In some embodiments, the insulating modifier 208 may include an insulator, conductor or semiconductor. The pair of modifiers 212, 214 may be a pair of sheets having a thin, flat shape. In other embodiments, the pair of modifiers 212, 214 may be other shapes such as tube shaped, wedge shaped, and/or have a beveled edge proximate the gap. In one embodiment, the modifiers 212, 214 may be fabricated of quartz, alumina, boron nitride, glass, silicon nitride, silicon carbide, etc.

In one embodiment, the horizontal spacing of the gap 216 defined by the pair of modifiers 212, 214 may be about 6.0 millimeters (mm). The pair of modifiers 212, 214 may also be positioned a vertical spacing (Z) above a plane 251 defined by a front surface of the substrate 238 or a surface of the substrate support 234. In one embodiment, the vertical spacing (Z) may be about 3.0 mm.

A gas source 288 is coupled to the processing chamber 200 to supply an ionizable gas to the interior processing region 209. Examples of an ionizable gas include, but are not limited to, $BF_3$, $BI_3N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $CF_4$, $AsF_5$, $PF_3$ and $PF_5$. The plasma source 206 may generate the plasma 240 by exciting and ionizing the gas provided to the processing chamber 200. Ions in the plasma 240 may be attracted across the plasma sheath 242 by different mechanisms. In the embodiment of FIG. 2A, a bias source 290 is coupled to the substrate support 234 configured to bias the substrate 238 to attract ions 202 from the plasma 240 across the plasma sheath 242. The bias source 290 may be a DC power supply to provide a DC voltage bias signal or an RF power supply to provide an RF bias signal.

It is believed that the insulating modifier 208 modifies the electric field within the plasma sheath 242 to control a shape of the boundary 241 between the plasma 240 and the plasma sheath 242. The boundary 241 between the plasma 240 and the plasma sheath 242 may have a convex shape relative to the plane 251. When the bias source 290 biases the substrate 238, ions 202 are attracted across the plasma sheath 242 through the gap 216 between the modifiers 212, 214 at a large range of incident angles. For instance, ions 202 following trajectory path 271 may strike the substrate 238 at an angle of positive θ (+θ) relative to the plane 251. Ions following trajectory path 270 may strike perpendicularly on the substrate 238 at about an angle of about 90 degrees relative to the same plane 251. Ions following trajectory path 269 may strike the substrate 238 an angle of negative θ (−θ) relative to the plane 251. Accordingly, the range of incident angles may be between about positive θ(+θ) and about negative θ (−θ), centered about 90 degrees. In addition, some ion trajectories paths such as paths 269 and 271 may cross each other. Depending on a number of factors including, but not limited to, the horizontal spacing (G) between the modifiers 212 and 214, the vertical spacing (Z) of the insulating modifier 208 above the plane 251, the dielectric constant of the modifiers 212 and 214, and other plasma process parameters, the range of incident angles (θ) may be between +60 degree and −60 degree centered about 0 degree. Hence, small three dimensional structures on the substrate 238 may be treated uniformly by the ions 202. For example, sidewalls 247 of the feature 244, which may be utilized to form a fin structure for FINFET devices, having an exaggerated size for clarity of illustration, may be more uniformly treated by the ions 202, rather than just a top surface 249.

Figure 2B:
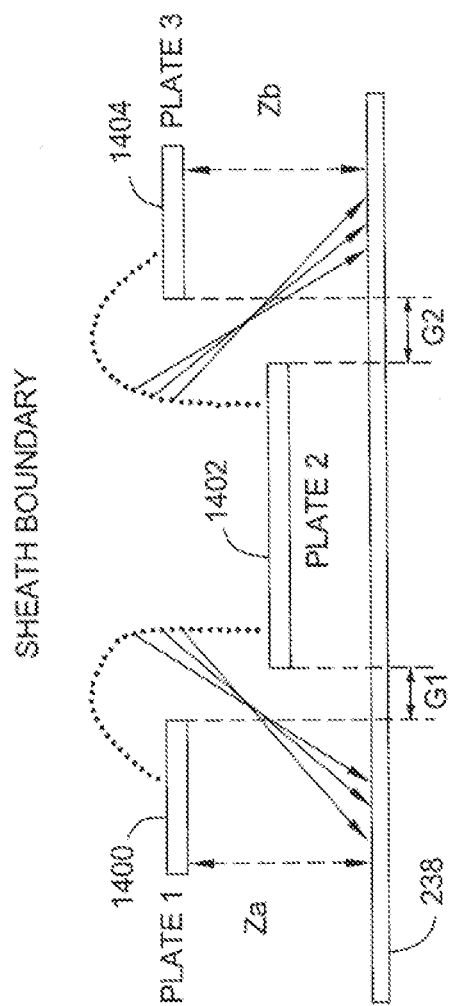
FIG. 2B depicts another embodiment of an apparatus to form dopants in a structure on a substrate.

Referring to FIG. 2B, in this embodiment, instead of a pair of modifiers 212 and 214 depicted in FIG. 2A, at least three modifiers 1400, 1402, 1404 are used to provide ions to the substrate 238 with desired angular distribution. By arranging the outer two modifiers 1400, 1404 on the same vertical plane (Za), and maintaining the same horizontal spacing G1, G2 between the modifiers 1400, 1402, 1404, a symmetric bimodal angular spread of ions, centered about +/−θ (+θ and 31 θ) degrees may be obtained. As described above, the incidental angles ions doped onto the substrate 238 may be modified by varying the vertical spacing between the outer modifiers 1400, 1404 and the middle modifier 1402, so as to vary the gap angles. The angular ion spread can be modified by varying the horizontal spacing (G1, G2) between the modifiers 1400, 1402, 1404, so as to vary the gap width defined by the horizontal spacing (G1, G2). An asymmetric distribution can be created by making Za different than Zb, by choosing G1 different than G2, or a combination of both actions.

Figure 7:
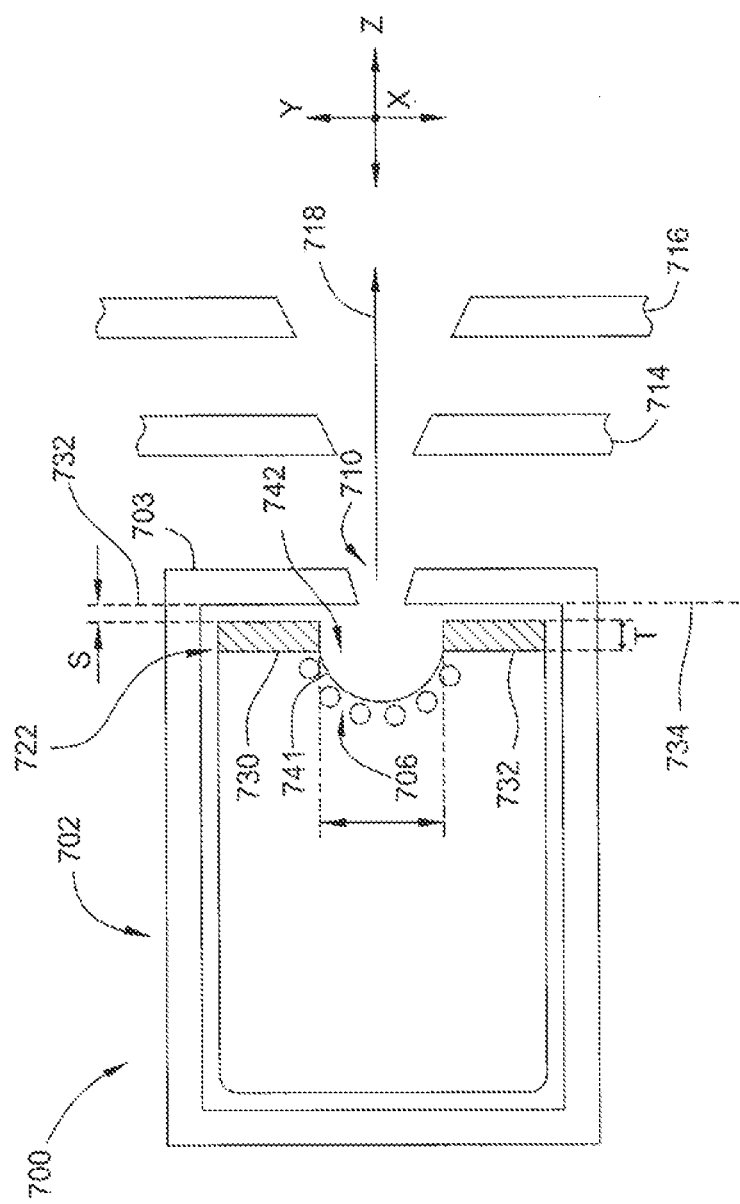
FIG. 7 depicts another embodiment of an apparatus which may be utilized to form dopants in a structure on a substrate.

Referring further to FIG. 7, FIG. 7 depicts another embodiment of a ion processing chamber 700 that may be utilized to provide ions into a substrate with desired and variable incident angles. The processing chamber 200 includes an arc chamber 702 having a sidewall 703 with an extraction aperture 710. The processing chamber 700 further includes a plasma sheath modulator 720 to control a shape of a boundary 741 between the plasma 740 and the plasma sheath 742 proximate the extraction aperture 710. An extraction electrode assembly extracts ions 706 from the plasma 740 and accelerates them across the plasma sheath 742 to desired extraction energy of a well-defined ion beam 718. The extraction electrode assembly may include the sidewall 703 functioning as an arc slot electrode, a suppression electrode 714 and a ground electrode 716. The suppression electrode 714 and the ground electrode 716 each have an aperture aligned with the extraction aperture 710 for extraction of the well-defined ion beam 718. To aid with explanation, a Cartesian coordinate system is defined where the ion beam 718 travels in the Z direction. The X-Y plane is perpendicular to the Z direction which can change depending on the direction of the ion beam 718.

In the embodiment of FIG. 7, the plasma sheath modulator 720 includes a pair of modifiers 730, 732 positioned in the arc chamber 702. In other embodiments, the modulator 720 may include one modifier. The modifiers 730, 732 may be fabricated of quartz, alumina, boron nitride, glass, porcelain, silicon nitride, etc. The pair of modifiers 730, 732 may be a pair of sheets having a thin, flat shape. In other embodiments, the pair of modifiers 730, 732 may be other shapes such as tube shaped, wedge shaped, and/or have a beveled edge. The pair of modifiers 730, 732 defines a gap there between having spacing (G). The pair of modifiers 730, 732 may also be positioned a vertical spacing (S) above the plane defined by an interior surface of the sidewall 703 having the extraction aperture 710.

In operation, a feed gas (not illustrated) is supplied to the arc chamber 702. Examples of a feed gas include, but are not limited to, $BF_3$, $BI_3N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $CF_4$, $AsF_6$, $PF_3$ and $PF_5$. The feed gas may originate from a gas source or may be vaporized from a solid source depending on the desired species. The feed gas is ionized in the arc chamber 702 to generate plasma 740. Those skilled in the art will recognize differing types of ion sources that generate plasma in differing ways, such as an indirectly heated cathode (IHC) source, a Bernas source, a RF source, a microwave source, and an electron cyclotron resonance (ECR) source. An IHC source generally includes a filament positioned in close proximity to a cathode, and also includes associated power supplies. The cathode (not illustrated) is positioned in the arc chamber 702. As the filament is heated, electrons emitted by the filament are accelerated towards the cathode to provide for heating of the cathode. The heated cathode, in turn, provides electrons into the arc chamber that have ionizing collisions with the gas molecules of the feed gas to generate plasma.

An extraction electrode assembly including the sidewall 703, the suppression electrode 714 and the ground electrode 716 extracts ions 706 from the plasma 740 in the arc chamber 702 into the well-defined on beam 718. The ions 706 are accelerated across the boundary 741 and the plasma sheath 742 through the gap between the pair of modifiers 730, 732. The sidewall 703 functioning as an arc source electrode may be biased by a power supply to the same large potential as the arc chamber 702. The suppression electrode 714 may be biased at a moderately negative value to prevent electrons from entering back into the arc chamber 702. The ground electrode 715 may be at ground potential. The strength of the electric field generated by the electrode assembly may be tuned to achieve a desired beam current and energy.

Advantageously, the plasma sheath modulator 720 controls a shape of the boundary 741 between the plasma 740 and the plasma sheath 742 proximate the extraction aperture 710. To control the shape of the boundary 741 the plasma sheath modulator 720 modifies or influences the electric field within the plasma sheath 742. When the plasma sheath modulator 720 includes the pair of modifiers 730, 732, the boundary 741 may have a concave shape relative to the plasma 740 as illustrated in FIG. 7. Depending on a number of factors including, but not limited to, the horizontal spacing (G) between the modifiers 730, 732, the vertical spacing (S) of the modifiers 730, 732 above the plane of the modifiers 730, 732, the material and thickness thereof of the modifiers 730, 732, and other process parameters of the ion source, the shape of the boundary 741 may be controlled.

The shape of the boundary 741 between the plasma 740 and the plasma sheath 742 together with the electric field gradients within the plasma sheath 742 control parameters of the ion beam. For example, the angular spread of the ions 706 can be controlled to assist with ion beam focusing. For instance, with the boundary 741 having a concave shape relative to the plasma, there is a large angular spread of ions accelerated across the boundary to assist with beam focusing. In addition, the ion beam current density of the ion beam 718 can also be controlled. For example, compared to the boundary 741 of one conventional ion source, the boundary 741 has a larger area to extract additional ions. Hence, the additional extracted ions contribute to an increased ion beam current density. Accordingly, with all other parameters being equal, the shape of the boundary 741 can provide a focused ion beam with a high ion beam current density. Furthermore, the emittance of the ion beam can also be controlled by controlling the shape of the boundary 741. Consequently, the beam quality of the extracted ion beam can be well defined for a given particle density and angular distribution.

Figure 8:
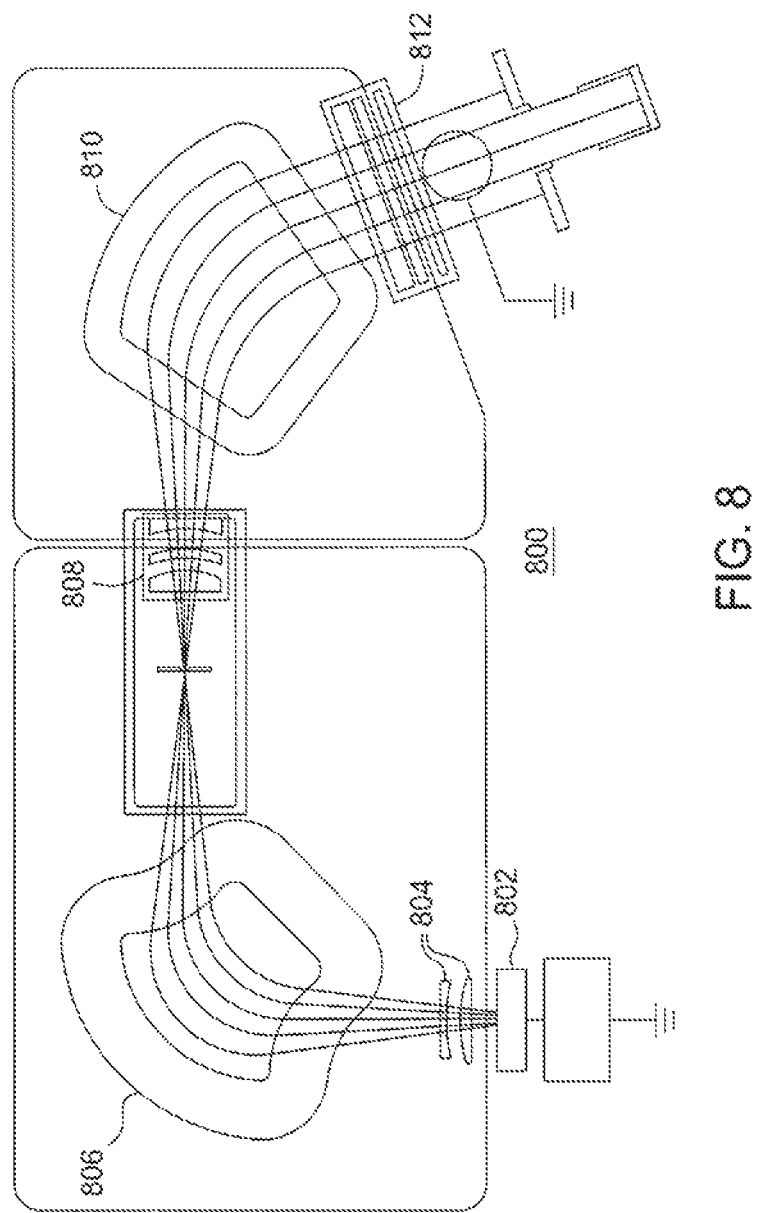
FIG. 8 depicts another embodiment of an apparatus which may be utilized to form dopants in a structure on a substrate.

Further referring to FIG. 8, FIG. 8 depicts a conventional ion implanting processing chamber 800 that may perform an ion doping process to dope ions into certain regions of the substrate. The ion implanting processing chamber 800 includes an ion source 802, extraction electrodes 804, a 90 degree magnet analyzer 806, a first deceleration (D1) stage 808, a magnet analyzer 810, and a second deceleration (D2) stage 812. The D1 and D2 deceleration stages (also known as "deceleration lenses") are each comprised of multiple electrodes with a defined aperture to allow an ion beam to pass therethrough. By applying different combinations of voltage potentials to the multiple electrodes, the D1 and D2 deceleration lenses can manipulate ion energies and cause the ion beam to hit a target wafer at a desired energy to be doped to a substrate. The above-mentioned D1 or D2 deceleration lenses are typically electrostatic triode (or tetrode) deceleration lenses.

Figure 3:
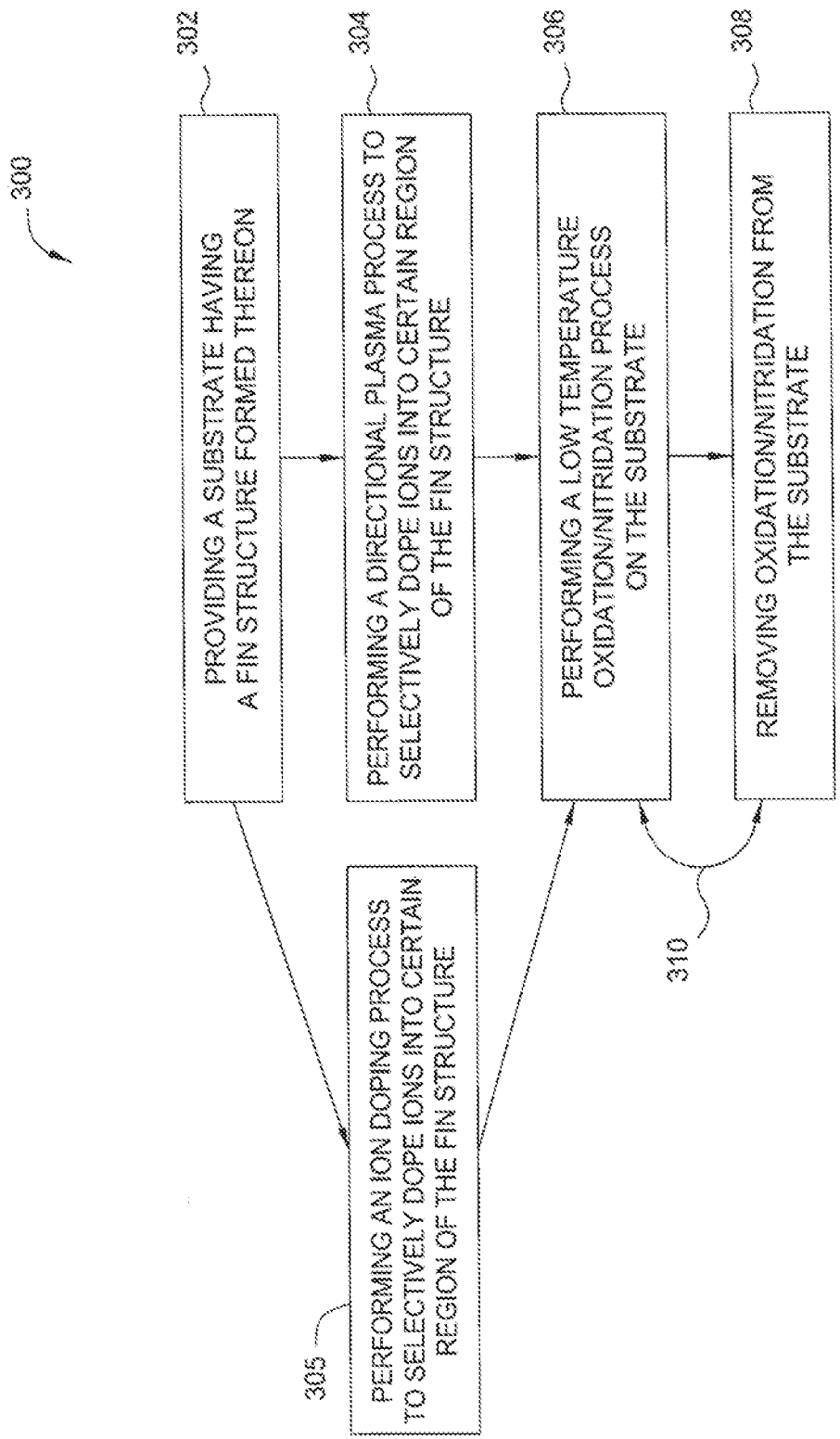
FIG. 3 depicts a flow diagram of a method for form fin structures with composite materials on a substrate.

Referring back to FIG. 3, FIG. 3 is a flow diagram of one embodiment of fin structure material conversion manufacturing process 300 that may be practiced in the processing chamber 200 along with other suitable processing chambers. FIGS. 4A-4E are schematic cross-sectional views of a portion of a composite substrate corresponding to various stages of the process 300. The process 300 may be utilized to form fin structures on a substrate having desired materials which may later be utilized to form a fin field effect transistor (FinFET) for three dimensional (3D) stacking of semiconductor chips. Alternatively, the process 300 may be beneficially utilized to etch other types of structures.

Figure 4A:
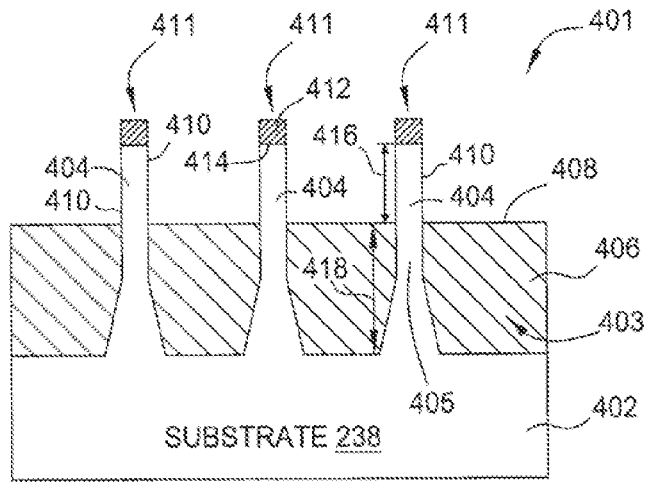
FIG. 4A-4E depict one embodiment of a sequence for forming form fin structures with desired materials during the manufacturing process.

The process 300 begins at block 302 by providing a substrate, such as the substrate 238 depicted in FIG. 2A-2B, having a plurality of fin structures 411 formed thereon, as shown in FIG. 4A. In one embodiment, the substrate 238 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 238 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 238, the substrate 238 may include a buried dielectric layer disposed on a silicon crystalline substrate. In the embodiment depicted herein, the substrate 238 may be a crystalline silicon substrate.

The fin structures 411 may have a hardmask 412 disposed thereon. The hardmask layer 412 disposed on the fin structures 411 may be utilized to protect a top surface 414 along with the corners of the fin structures 411 during the manufacturing process to prevent the fin structures 411 from profile damage or deformation. Suitable examples of the hardmask layer 412 may include silicon oxide, silicon nitride, silicon oxynitride, silicon carbide, amorphous carbon, doped amorphous carbon layer, or other suitable dielectric materials. In one embodiment, the hardmask layer 412 is a silicon nitride layer having a thickness between about 5 nm and about 100 nm, such as about 20 nm and about 40 nm, for example about 30 nm.

In one embodiment, the fin structures 411 may be formed in the substrate 238 by etching the substrate 238 to form recess structures 403 between the fin structures 411. The recess structures 403 is then filled with insulating materials to form shallow trench isolation (STI) structures 406 so as to facilitate forming the fin structures 411 therebetween for the fin field effect transistors (FinFET) manufacture process. As the fin structure 411 is formed by etching the substrate 238, thus, the fin structure 411 may be of the same material as the substrate 238, which is a silicon containing material. In the embodiment depicted herein, the substrate 238 is a silicon substrate so that the fin structure 411 formed therefrom is also a silicon material.

In one embodiment, the insulating material utilized to form the shallow trench isolation (STI) structures 406 may be a dielectric material, such as silicon oxide material. The insulating material may be formed by a plasma enhanced chemical vapor deposition (CVD), a flowable chemical vapor deposition (CVD), a high density plasma (HDP) chemical vapor deposition (CVD) process, atomic layer deposition (ALD), cyclical layer deposition (CLD), physical vapor deposition (PVD), or the like as needed. In one embodiment, the insulating material is formed by a flowable or plasma enhanced chemical vapor deposition (CVD).

In one embodiment, the shallow trench isolation (STI) structures 406 may be formed to have a first depth 418 so as to cover a bottom portion 405 of the fin structures 411, allowing an upper portion 404 with a second depth 416 of the fin structures 411 to protrude and extend from a top surface 408 of the shallow trench isolation (STI) structures 406. In one embodiment, the first depth 418 is between about 50 nm and about 100 nm from the substrate 402 to the top surface of the shallow trench isolation (STI) structures 406. The second depth 416 is between about 10 nm and about 60 nm above the top solace 408 of the shallow trench isolation (STI) structures 406.

The profile (e.g., shape or geometry) of the fin structures 411 depicted in FIGS. 4A-4E have a flared-out profile at the bottom portion 405 of the fin structure 411 that connects to the substrate 402. It is noted that the profile of the fin structures 411 formed in the substrate 402 may have different forms, including upward tapered or downward tapered-down sidewalls, or angled profiles, special sidewall features, overhang structures, or other profiles, as needed.

Figure 4B:
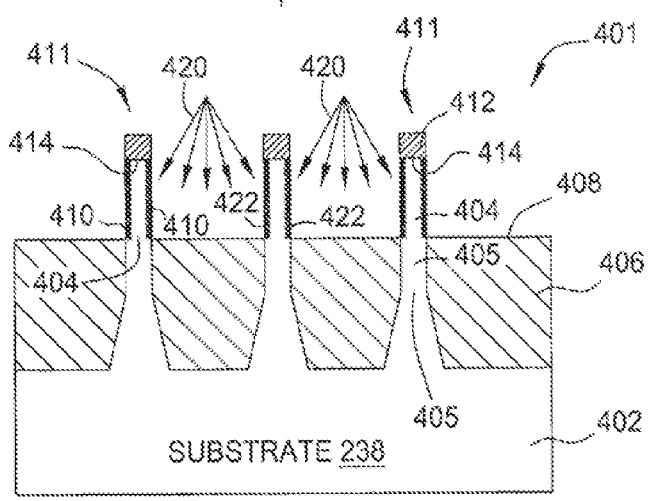

At block 304, a directional plasma process is performed to dope dopants into the fin structures 411, as shown in FIG. 4B. The directional plasma process may be performed in a directional plasma processing chamber, such as the processing chamber 200, 700, 800 depicted in FIG. 2A-2B, 7 or 8, or other suitable conventional on implantation processing tool that may provide a heated substrate. The directional plasma process is performed by implanting ions 420, with desired incident angles, to a selected region of the fin structures 411, such as the upper portion 404 through the sidewalls 410 of the fin structure 411. The ions, which include a first type of atoms, doped into the fin structures 411 form a modified layer 422 on the sidewalls 410 of the fin structure 411. The doping layer 422 provides dopants desired to be later formed in the upper portion 404 of the fin structure 411.

In one embodiment, the ions 420 generated from the processing chamber 200 are configured to have an incident angle between about 0 degrees and about 60 degrees. With the hardmask layer 412 remain on the top surface 414 of the fin structure 411, the ions 420 may mainly be doped into the sidewalls 410 of the fin structure 411 with controlled doping incident angles, rather than from the top surface 414 of the fin structure 411. By doing so, the profile of the top surface 414 at the top surface 414 and the sidewalls 410 may be shielded and protected from damage during the directional plasma process. In one embodiment, the directional plasma process may be performed for a period of time between about 1 seconds and about 180 seconds so as to dope dopants into the fin structure 411 with a doping concentration of between about 5E15 ions/cm$^2$ and about 5E16 ions/cm$^2$.

Several process parameters may be controlled during the directional plasma process. In one embodiment, an ion doping gas mixture may be supplied into the processing chamber during directional plasma process at a flow rate between about 10 sccm and about 200 sccm. Suitable gases for supplying in the ion doping gas mixture include $AsH_3$, $GaH_3$, $SiH_4$, $SiF_4$, $GeH_4$, $GeF_4$, $CH_4$, $CF_4$, $AsF_5$, $PF_3$, $PF_5$, $B_2H_6$, $BH_3$ and the like. Inert gas, such as Ar, He, Kr, Ne or the like, or carrier gases, such as $H_2$, $N_2$, $N_2O$, $NO_2$, or the like, may also be supplied into the ion doping gas mixture. The chamber pressure is generally maintained between about 0.1 mTorr and about 50 mTorr, such as about 5 mTorr. A RF power, such as capacitive or inductive RF power, DC power, electromagnetic energy, or magnetron sputtering, may be supplied into the processing chamber 200 to assist dissociating the gas mixture during processing. Ions generated by the dissociative energy may be accelerated toward the substrate using an electric field produced by applying a DC or RF electrical bias to the substrate support or to a gas inlet above the substrate support, or both. In some embodiments, the ions may be subjected to a mass selection or mass filtration process, which may comprise passing the ions through a magnetic field aligned orthogonal to the desired direction of motion. The electric field provided by the RF power may be capacitively or inductively coupled for purposes of ionizing the atoms, and may be a DC discharge field or an alternating field, such as an RF field. Alternately, microwave energy may be applied to the ion implanting gas mixture containing any of these elements to generate ions. In some embodiments, the gas containing energetic ions may be a plasma. An electrical bias (peak to peak voltage) of between about 50 V and about 10000 V, such as about 4000V is applied to the substrate support, the gas distributor, or both, to accelerate the ions toward the substrate surface with the desired energy. In some embodiments, the electrical bias is also used to ionize the ion implantation processing gas. In other embodiments, a second electric field is used to ionize the process gas. In one embodiment, a RF field with a frequency of about 2 MHz is provided to ionize the ion implantation processing gas and bias the substrate support at a power level between about 100 W and about 10000 W. The ions thus produced will generally be accelerated toward the substrate by biasing the substrate or a gas distributor as described above.

In some embodiments, the power used to generate ions may be pulsed. Power may be applied to the plasma source for a desired time, and then discontinued for a desired time. Power cycling may be repeated for a desired number of cycles at a desired frequency and duty cycle. In some embodiments, the plasma may be pulsed at a frequency between about 1 Hz and about 50,000 Hz, such as between about 5000 Hz and about 10000 Hz. In other embodiments, the plasma pulsing may proceed with a duty cycle (ratio of powered time to unpowered time per cycle) between about 10% and about 90%, such as between about 30% and about 70%. In one embodiment, the RF source power may be supplied at between about 100 Watts to about 5000 Watts and the bias power may be supplied at between about 50

Watts and about 11000 Watts. The process temperature may be controlled at between about 5 degrees Celsius and about 650 degrees Celsius.

In one embodiment, the doping gas mixture may include at least one or more of a Ge containing gas, Ga containing gas, As containing gas, P containing gas, B containing as or In containing gas, so that the first type of atoms includes at least one or more of Ge, Ga, As, P or In atoms from the doping layer 422. In one example, the doping gas supplied to the doping gas mixture is a Ge containing gas. Referring to FIG. 5A first for an enlarged view of the doping layer 422 formed on sidewall 410 of the fin structure 411, the first type of atoms 504 from the doping layer 422 may dope into and adhere on sidewall 410 of the fin structure 411. A second type of atoms 502 which predominantly form the fin structure 411 remains in the upper portion 404 of the fin structure 411. In other words, the second type of atoms 502 are from the material that comprises the substrate 238 from which the fin structure 411 was initially formed. In the embodiment wherein the doping gas is a Ge containing gas and the fin structure 411 is made from a silicon material, the first type of atoms 504 from the doping layer 422 are Ge atoms and the second type of atoms 502 which predominantly form the fin structure 411 is Si atoms. The Ge atoms 504 are primary located on the sidewall 410 of the fin structure 411 while the silicon atoms 502 are still the main components predominantly comprising the upper portion 404 of the fin structure 411 (e.g., at a center region of the fin structure 411). As Ge atoms 504 have a high molecular weight than the Si atoms 502, features utilized to represent Ge atoms 504 in FIG. 5A-5C are illustrated as having a greater size than the silicon atoms 502.

Alternatively, instead of performing a directional plasma process, a ion doping process utilizing a conventional ion implantation process, as indicated at the block 305, may also be used to provide ions into the fin structure 404. The conventional ion implantation process may be performed in a ionbeam processing chamber, such as the ion beam processing chamber depicted in FIG. 8, or it may be performed in any suitable processing chamber as needed.

Figure 4C:
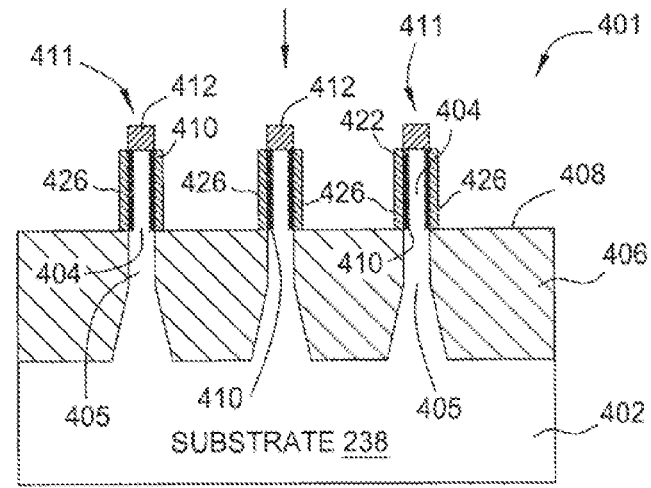

At block 306, after the ions are implanted into the fin structure 404, a surface modification process is performed to form a surface modified layer on the sidewalls 410 of the fin structure 411. The surface modification process may be a low temperature oxidation/nitridation process performed to form the surface modified layer, such as an oxidation/nitridation layer 426 on the sidewalls 410 of the fin structure 411, as shown in FIG. 4C. The low temperature oxidation/nitridation process consumes the silicon atoms 502 from the fin structure 404 and helps to push the Ge atoms 504 toward the center region of the fin structure 404, as shown in arrow 506 in FIG. 5B. Oxygen or nitrogen atoms from the oxidation/nitridation layer 426 pulls the silicon atoms 502 laterally and outward from the fin structure 411 to react with the silicon atoms 502 while driving the Ge atoms 504 inward to the center of the fin structure 411 away from the sidewall 410. By doing so, the silicon atoms 502 in the upper portion 404 of the fin structure 411 may be gradually pulled out of the center and react with the oxygen atoms/nitrogen atoms to form the oxidation/nitridation layer 426 on the sidewalls 410, leaving the Ge atoms 504 in the center of the fin structure 411 to replace the atomic sites previously occupied from the silicon atoms 502. As such, the silicon atoms 502 may gradually converted, replaced and driven out by the Ge atoms 504, leaving the fin structure 411 predominantly comprised of Ge atoms 504.

In one embodiment, the low temperature oxidation/nitridation process at block 306 may be performed in a suitable plasma processing chamber, including the processing chambers 200, 700, 800 depicted in FIG. 2A-2B, 7 or 8. The processing temperature is controlled at a low temperature range, such as less than 950 degrees Celsius. It is believed that the low temperature process may provide gentle thermal energy to consume the silicon atoms 502 and pushing laterally outward toward the sidewalls 410 where the oxygen/nitrogen atoms are present so as to form the silicon oxide/silicon nitride layer 426 on the sidewalls 410 without damaging the lattice structures as formed from the Ge atoms 504 left in the fin structure 411. By doing so, the silicon atoms 502 may be gradually and conformally replaced with the Ge atoms 504 without creating interfacial sites or atomic vacancies. In one embodiment, the process temperature may be performed between about 25 degrees Celsius and about 650 degrees Celsius.

In one embodiment, the oxidation/nitridation process may be performed in a plasma containing environment. The oxidation/nitridation process may be performed by using a treatment gas mixture to form a plasma in a processing environment to plasma treat the sidewalls 410 of the fin structure 411. In one embodiment, the treatment as mixture includes at least one of an oxygen containing gas, a nitrogen containing gas with or without an inert gas. In one example, an oxygen containing gas is utilized to oxidize the sidewall 410. Suitable examples of the oxygen containing gas include $O_2$, $O_3$, $H_2O$, $NO_2$, $N_2O$ and the like. In another example, a nitrogen containing gas is utilized to nitrodize the sidewall 410. Suitable examples of the nitrogen containing gas include $N_2$, $N_2O$, $NO_2$, $NH_3$ and the like. Suitable examples of the inert gas supplied with the treatment gas mixture include at least one of Ar, He, Kr, and the like. In an exemplary embodiment, the nitrogen or oxygen containing gas supplied in the treatment gas mixture is $N_2$ or $O_2$ gas with a flow rate between about 50 sccm and about 1000 sccm.

During the oxidation/nitridation process, several process parameters may be regulated to control the oxidation/nitridation process. In one exemplary embodiment, a process pressure is regulated between about 2 mTorr to about 500 mTorr. A RF bias power may be applied to maintain a plasma in the treatment gas mixture. For example, a RE bias power of about 10 Watts to about 500 Watts may be applied to maintain a plasma inside the processing chamber. A RF source power at a frequency may be applied to maintain a plasma in the treatment gas mixture. A substrate temperature is maintained between about 25 degrees Celsius to about 950 degrees Celsius, such as between about 400 degrees Celsius and about 950 degrees Celsius.

It is noted that that temperature of oxidation/nitridation process may be adjusted and varied (i.e., multiple step process) during the conversion process. For example, the temperature of oxidation/nitridation process may be reduced when the fin structure 404 gradually becomes richer in Ge atoms 504 so as to prevent the Ge rich fin structure 404 from melting.

In one embodiment, the oxidation/nitridation process is completed when the silicon atoms 502 in the fin structure 411 have mostly or entirely been pulled outward and laterally to react with the oxygen/nitrogen atoms, converting the fin structures 411 to include predominantly Ge atoms 504, (e.g., from a first type of atoms to a second type of atoms) as shown in FIG. 5C. It is noted that FIG. 5C depicts the fin structure 411 with Ge atoms 504 after the conversion process and the oxidation/nitridation layer 426 is removed from the fin structure 411. The overall process time of the oxidation/nitridation process may be determined by time mode after the silicon atoms 502 are predominantly replaced with or converted to Ge atoms 504. In one example, the substrate 238 is subjected to the oxidation/nitridation process for between about 5 seconds to about 5 minutes, depending on the oxidation/nitridation rate of the fin structure 411, pressure and flow rate of the gas. For example, the substrate 238 can be exposed to the oxidation/nitridation processes for about 1 second to about 120 seconds. In an exemplary embodiment, the substrate 238 is exposed to the oxidation/nitridation processes for about 30 seconds or less.

FIGS. 6A-6C depicts another similar mechanism how the silicon atoms 502 may be converted or enhanced to be converted to Ge atoms 504. Similarly, FIG. 6A depicts the fin structure 404 with the original silicon atoms 502 formed therein under the hardmask layer 412. Subsequently, as discussed above, ions from the directional plasma process (at block 304) or from the ion implanting (doping) process (at block 305) may provide Ge ions and H ions to be inserted into the fin structure 404 from the sidewalls 410, as shown in FIG. 6B. The Ge ions may be in form of $Ge_xH_y$, which x and y are integers, and the hydrogen ions may be in form of $H_2$, $H^+$ or $H_3^+$. Ions with different kind, including $Ge_xH_y$, $H_2$, $H^+$ or $H_3^+$, are all provided from the plasma. During the directional plasma or ion implantation process, ions first inserted into the fin structure 404 may be pushed further inward to the center of the fin structure 404 by the ions later inserted thereto. As shown in the enlarged view of the circled sidewall of fin structure 404 in FIG. 6C, the Ge atoms 504a first inserted into the fin structure 404, may be later densified or further knock-in by the Ge atoms 504b or $H_2$, $H^+$ or $H_3^+$, as shown in the area 602, later inserted into the fin structure 404, as shown by the arrow 604, called ion-assisted deposition and doping (IADD). By utilizing well selected incident ions to further knock-in ions into the fin structure, the ion dose may be enhanced and a good control of the directional deposition may be obtained to obtain densified and high dose fin structure 404 with desired atoms and materials.

Figure 4D:
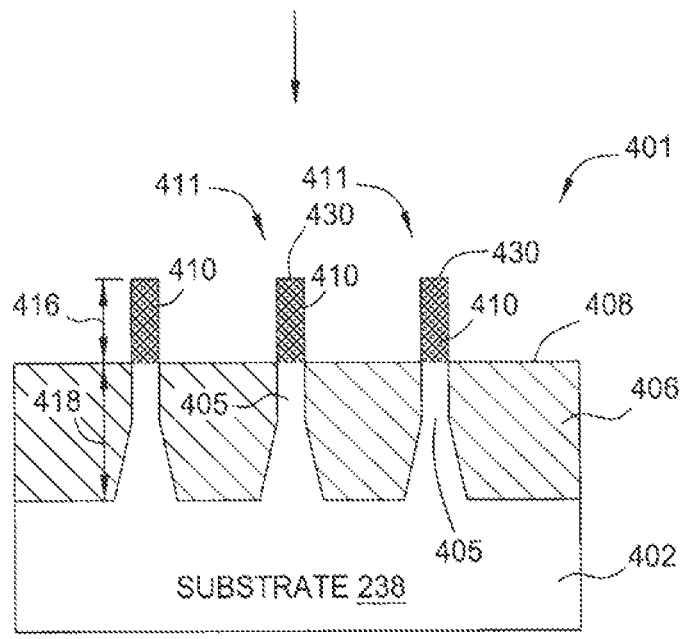

At block 308, after the oxidation/nitridation process, a oxidation/nitridation layer removal process is performed to remove the oxidation/nitridation layer 426 from the fin structure 411, as shown in FIG. 4D. In one embodiment, the oxidation/nitridation layer 426 may be removed from the fin structure 411 by dry etching process, wet etching process, or other suitable etching process.

In one embodiment, the oxidation/nitridation layer removal process may be performed by a dry etching process utilizing carbon containing gas, halogen containing gas or other suitable gases as an etchant. In one particular embodiment depicted here, the oxidation/nitridation layer removal process is performed by using a $NF_3/NH_3$ containing gas to remove an oxidation layer, or by using a $CF_4$ containing gas to remove a nitridation layer.

In another embodiment, the oxidation/nitridation layer removal process may be performed by soaking, dipping, flooding or immersing the substrate 238 into a solution comprising peroxide or other suitable etchants in organic solvent to remove the oxidation/nitridation layer 426.

After the oxidation/nitridation layer removal process, the hardmask layer 412 may also be removed, either during the oxidation/nitridation layer removal process or in a separate removal process chosen selectively to remove the hardmask layer 412.

It is noted that the low temperature oxidation/nitridation process performed at block 306 and the oxidation/nitridation layer removal process at block 308 may be repetitively performed, as indicated by the loop 310, to repeatively and gradually convert the fin structure 404 from the first type of materials to the second type of materials, rather than a one-time conversion process. The numbers of repetition between the block 306 and the block 308 may be varied and as many as needed until completion of the conversion process for the fin structure 404.

Figure 4E:
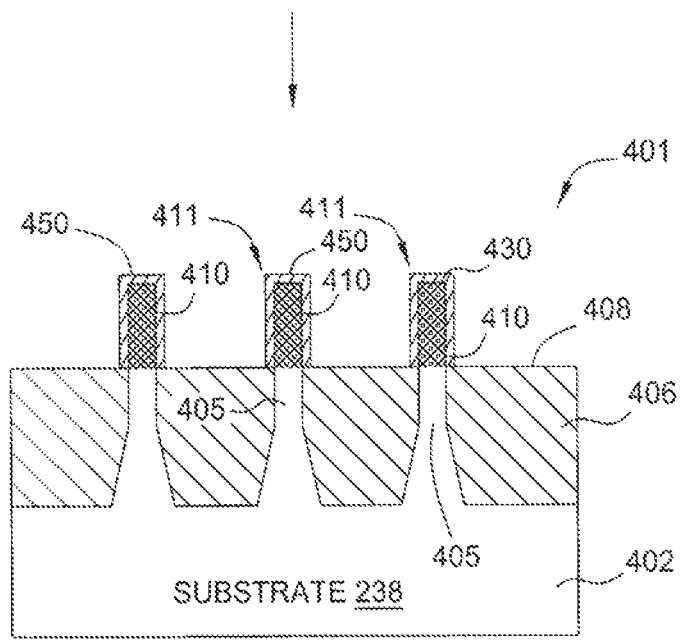

After the oxidation/nitridation layer removal process, an additional conformal layer 450 may be formed on the fin structure 411 as needed to increase the dimension of the fin structure 411 or alter the profile of the fin structure 411 as needed, as shown in FIG. 4E. Examples of the suitable conformal layer 450 include silicon germanium (SiGe), Ge containing layer, Group III-V materials, doped or undoped polysilicon materials, doped or undoped amorphous silicon materials, doped crystalline silicon materials and the like. The conformal layer 450 may be formed on the fin structure 411 using an EPI deposition process, CVD process, ALD process, or any other suitable deposition techniques.

Figures 9A, 9B:
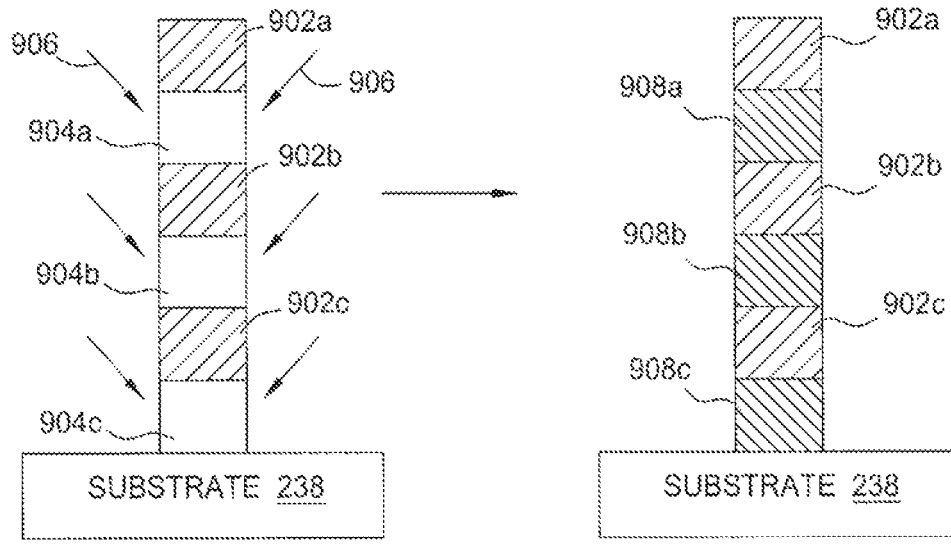
FIGS. 9A-9B depicts another embodiment of a structure that may utilize a conversion process to form desired material in the structure.

FIG. 9A-9B depict another embodiment of a protrusion structure 900 disposed on the substrate 238. The protrusion structure 900 may be a fin structure as described above. Alternatively, the protrusion structure 900 may be any suitable structure, including gate structures, contact structures, or any structures, that may be utilized the conversion process as described herein to convert first types of atoms in the structure 900 into a second type of atoms as desired.

The structure 900 may include composite materials including a first type of material, shown as 902a, 902b, 902c, interleaved with a second type of material, shown as 904a, 904b, 904c, as depicted in FIG. 9A. In one example, the first type of material, shown as 902a, 902b, 902c is silicon oxide material, and the second type of material, shown as 904a, 904b, 904c is silicon material. Similarly, a directional plasma process, as described at block 304, or an ion doping process, as described at block 305, may be performed to provide, implant, dope, or insert incident ions 906, such as Ge ions, group III or group V ions, or other suitable ions, into the structure 900 through its sidewalls. By utilizing different material properties from the composite materials between the first type of material 902a, 902b, 902c, and the second type of material, 904a, 904b, 904c, ions as doped or inserted into the structure 900 may selectively only push certain material outward to be removed during the subsequent processes, rather than every material formed in the structure 900. For example, silicon oxide from the first type of material 902a, 902b, 902c may not be converted to dominantly include the inserted ions, as the silicon atoms from the silicon oxide of the first type of material 902a, 902b, 902c are strongly bonded with the oxygen atoms and would not be replaced or driven out during the subsequent oxidation/nitridation process at block 306. In contrast, silicon atoms from the second type of the material, 904a, 904b, 904c may be converted, driven out and pushed outward by the inserted ions to react with the oxygen atoms or nitrogen atoms during the subsequent oxidation/nitridation process. By utilizing composite materials formed in the structure 900, selective conversion process occurred preferentially or dominantly on certain material may be obtained. In the embodiment depicted in FIG. 9B, the silicon material from the second type of materials 904, 904b, 904c may be converted to include dominantly the doped ions/atoms, such as Ge ions, group III or group V ions, or other suitable ions, so as to convert the second type of material 904, 904b, 904c with the third type of material, 908a, 908b, 908c, such as the Ge atoms, group III or group V atoms, or other suitable atoms.

Figures 10A, 10B:
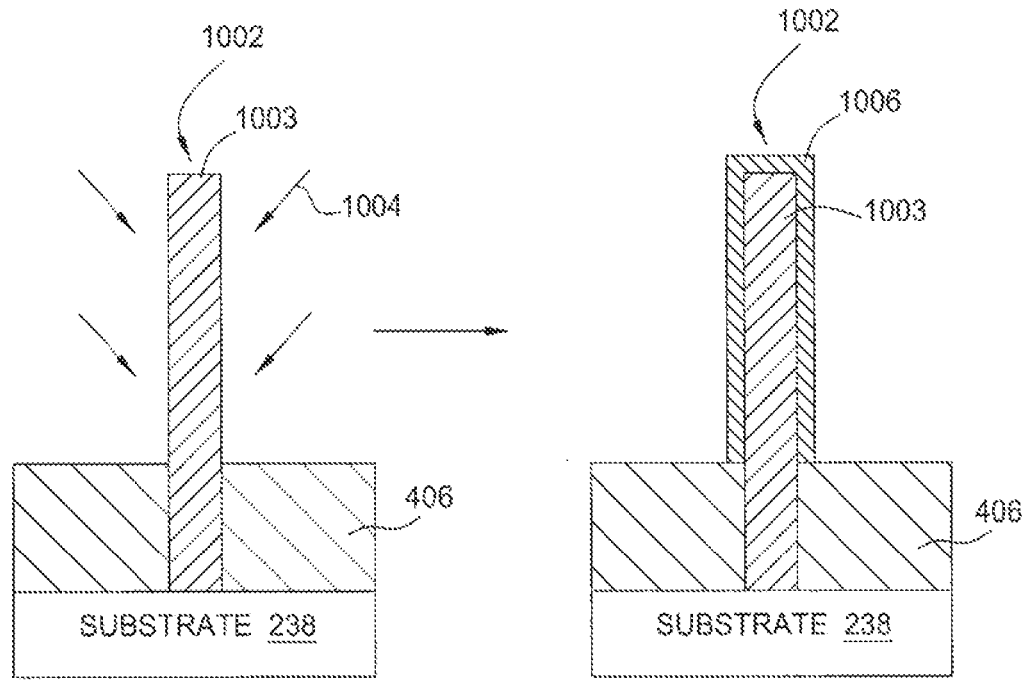
FIGS. 10A-10B depicts another embodiment of a structure that may utilize a directional plasma deposition process to form desired material in the structure.

FIGS. 10A-10B depict yet another embodiment of a protrusion structure 1002 formed on the substrate 238. Similarly, the structure 1002 may be utilized to form a gate structure, a fin structure, a contact structure, or any other suitable structure as needed. The substrate 238 may have the structure 1002 formed thereon surrounded by STI 406 or insulating materials. Similarly, a directional plasma process, as described at block 304, or an ion doping process, as described at block 305, may be performed to provide, implant, dope, or insert incident ions 1004, such as Ge ions, group III or group V ions, or other suitable ions, into the structure 1002 through its sidewalls and/or outer surface. With the sidewall occupied with the inserted ions, an epi deposition process or other suitable deposition process may be subsequently performed utilizing the doped sidewall as a seed/nucleation layer to facilitate the growing/deposition process. In the embodiment depicted in FIG. 10B, a Ge containing layer 1006, or group III-V layer may be epi deposited on the outer surface of the structure 1002 white remaining the center portion 1003 of the structure 1002 with original material without alternation.

Thus, methods for methods for forming fin structures with desired materials using a conversion process for three dimensional (3D) stacking of fin field effect transistor (FinFET) for semiconductor chips are provided. The methods utilize a conversion process to convert first type of atoms from a fin structure to a second type of atoms by an directional plasma process. The directional plasma process provides sources of the second type of atoms to replace atomic cites occupied by the first type of atoms, and converting the first type of atoms with the second type of atoms by thermal diffusion and chemical reaction. After the conversion, the first type of atoms are driven out and removed from the fin structure, leaving the second type of the atoms predominantly comprising the fin structure. Thus, a fin structure with desired type of material formed in the fin structure may be obtained, particularly for applications in three dimensional (3D) stacking of semiconductor fin field effect transistors (FinFET).

While the foregoing is directed to embodiments of the present invention, other and further embodiments of the invention may be devised without departing from the basic scope thereof, and the scope thereof is determined by the claims that follow.

The invention claimed is:

1. A method of forming a fin structure on a substrate comprising:
performing a directional plasma process on a fin structure formed from a substrate predominantly comprising a first type of atoms, the directional plasma process dopes a second type of atoms on sidewalls of the fin structure;
performing a surface modification process to form a surface modified layer on the sidewalls of the fin structure reacting with the first type of atoms; and
replacing the first type of the atoms with the second type of the atoms in the fin structure during the surface modification process until the fin structure comprises predominantly the second type of the atoms, wherein the second type of atoms are at least one of Ge, Ga, In, P or As atoms.

2. The method of claim 1, wherein forming the directional plasma process further comprising:
doping ions into the sidewalls of the fin structure with an ion incident angle of between about 0 degrees and 60 degrees.

3. The method of claim 1, wherein the fin structure includes a hardmask layer disposed on a top surface.

4. The method of claim 1, wherein the first type of atoms are silicon atoms.

5. The method of claim 1, wherein the second type of atoms is Ge atoms.

6. The method of claim 1, wherein performing the surface modification process further comprising:
oxidizing or nitridizing the sidewalls of the fin structure.

7. The method of claim 6, further comprising:
forming an oxidation layer or a nitridation layer on the sidewalls of the fin structure by reacting with the first type of the atoms from the fin structure.

8. The method of claim 7, wherein forming an oxidation layer or a nitridation layer on the sidewalls of the fin structure further comprising:
removing the oxidation layer or the nitridation layer from the sidewalls.

9. The method of claim 8, wherein the oxidation layer or the nitridation layer is removed from the sidewalls by a dry etching process.

10. The method of claim 8, further comprising:
removing a hardmask layer from the fin structure after removing the oxidation layer or the nitridation layer from the fin structure.

11. The method of claim 1, wherein the surface modification process is controlled at a temperature range less than about 950 degrees Celsius.

12. The method of claim 1, further comprising:
forming a conformal layer on an outer surface of the fin structure having the second type of atoms.

13. A method of forming a fin structure on a substrate comprising:
doping first type of atoms into a fin structure formed on a substrate, the fin structure including a second type of atoms;
oxidizing or nitridizing the fin structure to react with the second type of atoms formed from the substrate, forming an oxidation layer or a nitridation layer on the fin structure; and
converting the fin structure to have predominantly the first type of atoms wherein the second type of the atoms are substantially formed as the oxidation layer or the nitridation layer.

14. The method of claim 13, further comprising:
removing the oxidation layer or nitridation layer from the fin structure.

15. The method of claim 14, wherein removing the oxidation layer or nitridation layer from the fin structure further comprises:
etching the oxidation layer or nitridation layer from the fin structure.

16. The method of claim 15, wherein etching the oxidation layer or nitridation layer further comprises:
controlling the substrate temperature to less than about 950 degrees Celsius.

17. The method of claim 13, wherein doping the first type of atoms into the fin structure further comprises:
doping the first type of atoms into sidewalls of the fin structure with an incident angle of between about 0 degrees and about 60 degrees.

18. The method of claim 13, wherein the first type of atoms include Ge, Ga, As, In or P.

19. A method of forming a fin structure on a substrate comprising:
- doping first type of atoms into sidewalls of a fin structure formed on a substrate, the fin structure formed predominantly from a second type of atoms;
- diffusing the first type of atoms to a center region where the second type of atoms are located in the fin structure; and
- replacing the second type of atoms with the first type of atoms until the fin structure is predominantly comprised of the first type of atoms, wherein the first type of atoms are at least one of Ge, Ga, In, P or As atoms.

20. The method of claim 19, further comprising: removing the second type of atoms from the fin structure.

* * * * *

UNITED STATES PATENT AND TRADEMARK OFFICE
CERTIFICATE OF CORRECTION

| | | |
|---|---|---|
| PATENT NO. | : 9,553,174 B2 | Page 1 of 1 |
| APPLICATION NO. | : 14/622647 | |
| DATED | : January 24, 2017 | |
| INVENTOR(S) | : Ludovic Godet et al. | |

It is certified that error appears in the above-identified patent and that said Letters Patent is hereby corrected as shown below:

In the Specification

In Column 4, Line 1, delete "FIG." and insert -- FIGS. --, therefor.
In Column 4, Line 4, delete "FIG." and insert -- FIGS. --, therefor.
In Column 4, Line 6, delete "FIG." and insert -- FIGS. --, therefor.
In Column 6, Line 21, delete "31 θ)" and insert -- -θ) --, therefor.
In Column 7, Line 4, delete "AsF$_6$," and insert -- AsF$_5$ --, therefor.
In Column 7, Line 25, delete "on" and insert -- ion --, therefor.
In Column 9, Line 19, after "(HDP)" insert -- , --.
In Column 9, Line 35, delete "solace" and insert -- surface --, therefor.
In Column 9, Line 49, delete "FIG." and insert -- FIGS. --, therefor.
In Column 9, Line 50, delete "on" and insert -- ion --, therefor.
In Column 11, Line 6, delete "as" and insert -- gas --, therefor.
In Column 11, Line 31, delete "FIG." and insert -- FIGS. --, therefor.
In Column 11, Line 39, delete "ionbeam" and insert -- ion beam --, therefor.
In Column 12, Line 4, delete "FIG." and insert -- FIGS. --, therefor.
In Column 12, Line 24, delete "as" and insert -- gas --, therefor.
In Column 12, Line 44, delete "RE" and insert -- RF --, therefor.
In Column 12, Line 52, delete "that that" and insert -- that --, therefor.
In Column 14, Line 2, delete "repeatively" and insert -- repetitively --, therefor.
In Column 14, Line 22, delete "FIG." and insert -- FIGS. --, therefor.
In Column 15, Line 22, delete "white" and insert -- while --, therefor.

Signed and Sealed this
Twenty-third Day of May, 2017

Michelle K. Lee
*Director of the United States Patent and Trademark Office*